United States Patent
Livolsi et al.

(10) Patent No.: US 7,053,659 B2
(45) Date of Patent: May 30, 2006

(54) CMOS HIGH SPEED LEVEL SHIFTING DIFFERENTIAL RECEIVER

(75) Inventors: Robert R. Livolsi, Shokan, NY (US); Wayne L. Gerber, Kingston, NY (US); Carlos I. Gomez, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 10/818,571

(22) Filed: Apr. 6, 2004

(65) Prior Publication Data

US 2005/0218931 A1    Oct. 6, 2005

(51) Int. Cl.
*H03K 19/175*    (2006.01)

(52) U.S. Cl. .......................... 326/81; 326/68; 327/333

(58) Field of Classification Search ................ 326/81, 326/68, 86; 327/333
See application file for complete search history.

(56) References Cited

U.S. PATENT DOCUMENTS

| 5,406,142 | A  | * | 4/1995  | Nakama et al. ............... 326/68 |
| 6,046,610 | A  |   | 4/2000  | Livolsi |
| 6,667,648 | B1 | * | 12/2003 | Stout et al. ................. 327/333 |
| 6,774,698 | B1 | * | 8/2004  | Bhattacharya et al. ....... 327/333 |

* cited by examiner

*Primary Examiner*—Daniel D. Chang
(74) *Attorney, Agent, or Firm*—Lynn L. Augspurger; James E. Murray

(57) ABSTRACT

Rapid switching is provided by a circuit that controls the current passing through a chain of CMOS devices arranged in a series circuit. A node output terminal to the circuit is provided intermediate the chain to control the partially conductive state of two other CMOS devices. Voltages at the output terminal sets one or the other of the two CMOS devices in the current conducting state. That state is a partially conducting state of the CMOS device so that small changes flowing in the current path allows a quick transfer of the operating state to the other device. With this arrangement, discharging of large capacitances is avoided by using the small current changes to rapidly switch between the partially conducting CMOS devices.

12 Claims, 2 Drawing Sheets

CMOS HIGH SPEED LEVEL SHIFTING DIFFERENTIAL RECEIVER

FIELD OF THE INVENTION

This invention is related to sensing circuits. More particularly, this invention relates to sensing circuit for interfacing CMOS switching circuits powered at two different voltage levels.

BACKGROUND OF THE INVENTION

A level shifting circuit is one with one portion of the circuit operating off one supply level while the other operates off a different supply level. An example of such a level switching circuit is one that links peripheral circuits which have a supply level of 1.8 volts to core circuits which operate at a 1.2 volts nominal. Therefore in this case, the front end of the receiver receives signals generated by circuits operating at the peripheral supply and provides outputs to circuits which operate with the core supply level which is lower than the peripheral supply level. Standard level shifters are very slow. This is because the capacitive loads of the CMOS devices in the receiving circuit are hard to shift from one operating state to another operating state but also to the systems that are the CMOS devices. As the operating speed of CMOS circuits has increased, the capacitive nature of the CMOS devices in the CMOS circuits has been an impediment to not only rapid operation of level shifting circuits. Further, most prior art level shifters provide an asymmetric output.

Therefore it is an object of the present invention to provide a higher speed level shifting circuit.

A further object of the invention is to provide a high speed level shifting circuit with an symmetric output.

Another object of the invention is to provide a circuit capable of switching large voltages rapidly.

BRIEF DESCRIPTION OF THE INVENTION

In accordance with the present invention rapid switching is provided by a circuit that controls the current passing through a chain of CMOS devices arranged in a series circuit. A node input terminal to the circuit is provided intermediate the chain to control the operating state of two serially connected CMOS devices. Voltages at the input terminal sets one or the other of the serially connected devices in the current conducting state. That state is a partially conducting state of the device so that small changes in the current path allows a quick transfer of the operation state to the other device. With this arrangement, charging and discharging of large capacitances is avoided by using small current changes to rapidly switch between operating states.

DETAILED DESCRIPTION OF THE INVENTION

Figure 1:
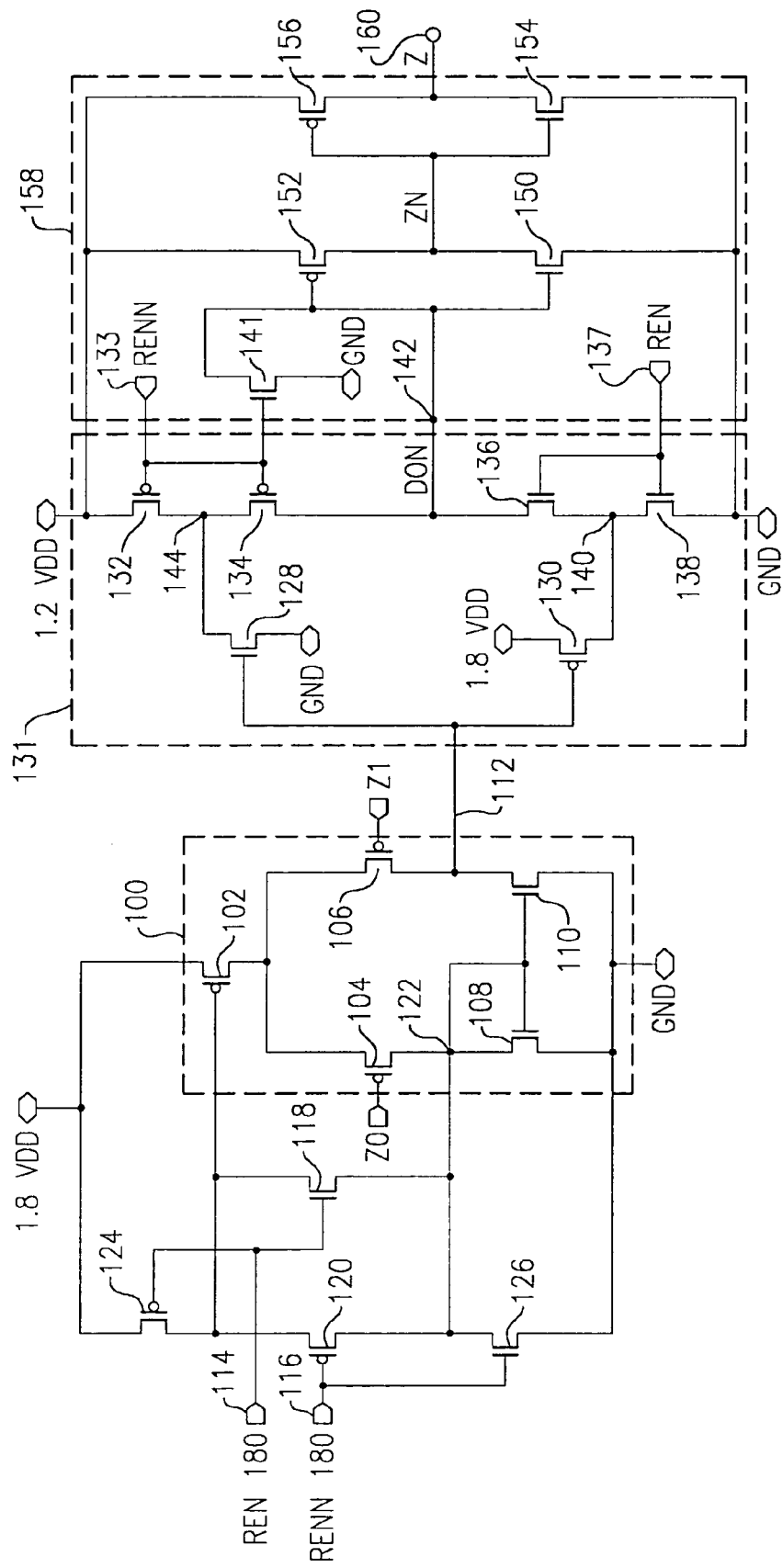
FIG. 1 is a circuit diagram of the preferred embodiment of the invention.

All devices shown in the drawings are metal oxide semiconductor field effect transistors (MOSFET or CMOS devices).

Referring to FIG. 1, the input stage 100 of the receiver contains devices 102, 104, 106, 108 and 110 that operate off the 1.8 volt peripheral supply level. The input stage 100 receives a double ended input ZO/Z1 on the gates of devices 104 and 106 and provides an output at terminal 112 of the input stage. When in its operating state, the input stage 100 of the receiver provides an up voltage at terminal 112 when ZO is more positive than Z1 and a down voltage at terminal 112 when Z1 is larger or up signal.

The operating state of the input stage 100 is controlled by the REN voltage applied to terminal 114 and the RENN voltage applied to terminal 116. To hold the input stage 100 in its inoperative state, the REN voltage at terminal 114 is set to zero while the RENN voltage at terminal 116 is set to 1.8 volts. This turns off device 118 and 120 while turning on devices 124 and 126. This turns off device 102 and reduces the voltage at node 122 to near ground turning off devices 108 and 110 so that the input stage 100 is not powered and its output at terminal 112 is indeterminate.

To activate the input stage 100, the voltages at terminals 114 and 116 are reversed. With the REN voltage at terminal 114 in the up state of 1.8 volts, and the RENN voltage at terminal 116 in the down state or zero volts, devices 118 and 120 are biased conductive. With devices 118 and 120 conducting device 102 conducts powering up the input stage 100. With the input stage powered, the voltage at ZO/Z1 determines the state of devices 104 and 106. With ZO up and Z1 down, 106 and 102 conduct so that the voltage at 122 is down holding devices 108 and 110 down so that the voltage at point 112 is up. When Z1 is up and ZO is down, device 104 conducts allowing the voltage at point 122 to rise turning on devices 108 and 110 thus lowering the voltage at point 112.

The output at terminal 112 is provided to the gates of devices 128 and 130 in the transitional stage 131 of the receiver. The transitional stage 131 operates on both the 1.8 and 1.2 voltage sources. Like the input stage REN and RENN, voltages control the operating state of the transitional stage 131. In the case of the transitional stage, the REN and RENN voltages vary between 1.2 and zero volts instead of between 1.8 and zero volts. With RENN at 1.2 volts and REN at 0 volts, the intermediate stage output node 142 is held at 0 volts by the biasing of devices 132 and 134 nonconductive and device 141 conductive by the 1.2 volts at terminal 133 and devices 136 and 138 off by the zero volts at terminal 137. To activate the intermediate stage 131 of the receiver, the voltages at terminals 133 and 137 are reversed. That is, with zero volts at terminal 133 and 1.2 volts at terminal 137, the voltage at point 112 determines the operation of devices 128 and 130 which that in turn control the current running through devices 132, 134, 136 and 138 that which in response provides an output at terminal 142. With 112 down, 128 is nonconductive while 130 is conductive. With 130 conductive, the voltage at point 140 is raised turning off device 136 and raising the voltage at node 142. Alternatively, if the voltage level at 112 is up, device 128 conducts reducing the voltage at point 144 turning on device 132 and lowering the voltage at point 142.

Figure 2:
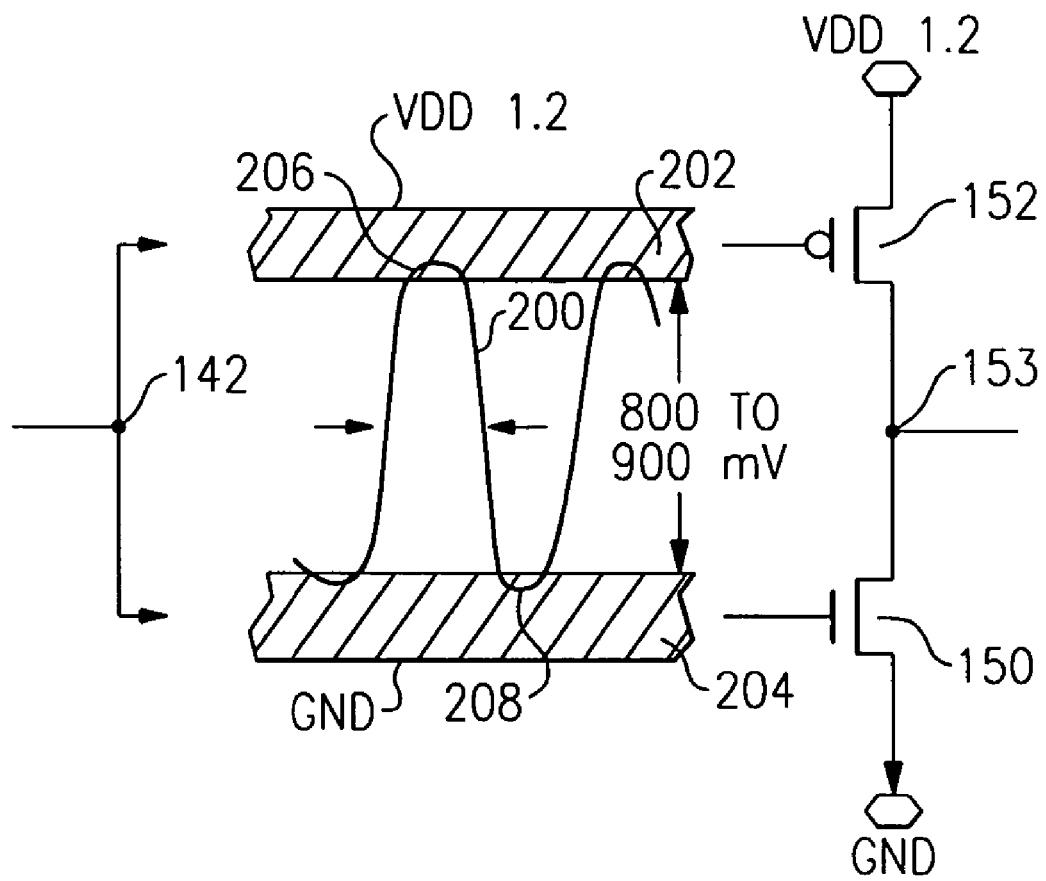
FIG. 2 is a voltage pattern for operation of the circuit shown in FIG. 1.

The voltage at point 142 controls operation of devices 150 and 152 in the output stage 158. As better shown in FIG. 2, the voltage swing 200 at the output terminal varies to bring it into the conducting zones 202 and 204 of devices 150 and 152. The voltage 200 is selected so that at its peaks 206 and 208 the voltage is barely in the conducting zone 204 or 206 enabling changes of voltage at point 142 to cause conduction to switch from one of the devices 150 or 152 to the other. If the voltage is up, 150 conducts. If the voltage is down, 152 conducts. Thus small swings in current through devices 130 and 128 can switch devices 150 and 152 in and out of their conductive regions 202 and 204 avoiding having to fully charge and discharge those devices. In the illustrated embodiment, the voltage swing is around 800 to 900 mv causing the peaks to intrude less than 10% into the conducting zones 202 and 204 of the devices.

Devices 154 and 156 constitute driver stage 158 which increases the size of the signal at point 153. Devices 150 and 152 constitute one inverter stage while devices 154 and 156 constitute another inverter stage so that there is no change in polarity between the signal at 142 and that provided at the output 160.

One embodiment of the invention has been described. Variations of this embodiment may be apparent to those skilled in the art. For instance, the switching technique described in connection with the intermediate stage may be applicable to circuits other than level shifters. Therefore it should be understood that the invention is not limited to the described embodiment but should be interpreted in terms of the spirit and scope of the appended claims.

What is claimed is:

1. A receiver for receiving binary signals by a circuit powered at a first level from a circuit powered at a second level comprising:
   a first level shifter stage for producing an input signal;
   a second level shifter stage responsive to the input signal including:
      a multiple device path with an output point between two devices; and
      a current diverting circuit responsive to the input signal to select which of the two devices is in the partial conducting state to provide an information carrying signal at the output point; and
   a third level shifter stage including two serially connected devices responsive to the information carrying signal to place one of the two serially conductive devices into a partially conductive state.

2. The receiver of claim 1, wherein the first level shifter stage operates powered at said second power level, the second level shifter stage operates powered at both the first and second power level and the third level shifter stage operates powered at the first power level.

3. The receiver of claim 1, wherein said two serially connected devices are biased to operate at the fringe of their conducting/non-conducting states.

4. The receiver of claim 3, wherein the two serially conductive devices are one P-gate CMOS device and one N-gate CMOS device with the conducting one of said devices charged to less than 10 percent of its fully charged operating state.

5. The receiver of claim 4, wherein said multiple device path includes pairs of CMOS devices on each side of the output point.

6. The receiver of claim 5, wherein the current diverting circuit contains CMOS devices with gates connected to receive the input signal and having current diverting points between the pairs of CMOS devices.

7. A switching circuit comprising:
   a multiple device path with an output point intermediate devices in the multiple device path to provide an input to the gates of two CMOS devices with one CMOS device in a partial conducting state conducting current at less than 10 percent of its saturated current conducting state and the other CMOS device in a non-conducting state; and
   a current diverting circuit responsive to an input signal to the switching circuit to control current flow in the multiple device path and thereby select which of the two CMOS devices is in the partial conducting state to provide an information carrying signal at the output point.

8. The switching circuit of claim 7, wherein said two devices are biased to operate at the fringe of their conducting/non-conducting states.

9. The switching circuit of claim 8, wherein said multiple device path includes pairs of CMOS devices on each side of the output point.

10. The switching circuit of claim 9, wherein the current diverting circuit contains CMOS devices with gates connected to receive the input signal and having current diverting points between the pairs of CMOS devices.

11. The switching circuit of claim 7, wherein one of said two CMOS devices is a P-gate device and the other is an N-gate device.

12. The switching circuit of claim 9, wherein the outputs of the two CMOS devices are coupled together to provide a symmetric output.

* * * * *